(12) United States Patent
Agawa

(10) Patent No.: US 12,075,537 B2
(45) Date of Patent: Aug. 27, 2024

(54) CONTROL METHOD OF INSPECTION APPARATUS AND INSPECTION APPARATUS

(71) Applicant: Tokyo Electron Limited, Tokyo (JP)

(72) Inventor: Hiroaki Agawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 389 days.

(21) Appl. No.: 17/447,457

(22) Filed: Sep. 13, 2021

(65) Prior Publication Data

US 2022/0104326 A1 Mar. 31, 2022

(30) Foreign Application Priority Data

Sep. 25, 2020 (JP) ................... 2020-161313

(51) Int. Cl.
*G01R 31/28* (2006.01)
*H05B 45/12* (2020.01)
*H05B 45/40* (2020.01)

(52) U.S. Cl.
CPC ......... *H05B 45/40* (2020.01); *G01R 31/2875* (2013.01); *H05B 45/12* (2020.01)

(58) Field of Classification Search
CPC .... H05B 45/40; H05B 45/12; G01R 31/2875; G01R 33/00
See application file for complete search history.

(56) References Cited

U.S. PATENT DOCUMENTS

2014/0104415 A1* 4/2014 Fox .......................... G01C 3/08
348/135
2018/0059014 A1* 3/2018 Ruback .................. H04N 23/63

FOREIGN PATENT DOCUMENTS

JP 2019-102645 6/2019
WO WO-2019107079 A1 * 6/2019 ............ G01R 31/26

\* cited by examiner

*Primary Examiner* — Jermele M Hollington
*Assistant Examiner* — Taqi R Nasir
(74) *Attorney, Agent, or Firm* — IPUSA, PLLC

(57) ABSTRACT

A control method of an inspection apparatus including a stage on which a substrate having an inspection object to be inspected is mounted and a plurality of light sources configured to emit light to heat the substrate includes: individually lighting the plurality of light sources and obtaining a plurality of first temperature distributions of the substrate; obtaining a second temperature distribution representing a sum of the plurality of first temperature distributions; obtaining one or more correction values for correcting an amount of light output from at least one or more light sources of the plurality of light sources based on the second temperature distribution; and correcting the amount of light output from each of the at least one or more light sources using the one or more correction values.

9 Claims, 9 Drawing Sheets

CONTROL METHOD OF INSPECTION APPARATUS AND INSPECTION APPARATUS

CROSS-REFERENCE TO RELATED APPLICATION

The present application is based upon and claims priority to Japanese Patent Application No. 2020-161313, filed on Sep. 25, 2020, the entire contents of which are incorporated herein by reference.

BACKGROUND

1. Field

The present disclosure relates to a control method of an inspection apparatus and an inspection apparatus.

2. Background Art

Patent Document 1 discloses a prober that sequentially inspects, by a tester, electrical characteristics of a plurality of chips to be inspected provided in matrix. The prober includes a plurality of LED units and a controller configured to output a control signal to drive the LED units. The plurality of LED units are provided on a side opposite to a placing surface of a stage so as to independently heat a plurality of areas where the plurality of chips are located, respectively. The controller outputs a control signal to drive, among the plurality of LED units, at least an LED unit corresponding to an area of a chip to be inspected, among the area of the chip to be inspected and peripheral areas of the corresponding area.

PRIOR ART DOCUMENT

Patent Document

[Patent Document 1] Japanese Laid-open Patent Publication No. 2019-102645

The present disclosure provides a technique that enables to correct a control command so as to evenly heat an inspection object to be inspected.

SUMMARY OF THE INVENTION

According to one aspect of the present disclosure, a control method of an inspection apparatus including a stage on which a substrate having an inspection object to be inspected is mounted and a plurality of light sources configured to emit light to heat the substrate includes: individually lighting the plurality of light sources and obtaining a plurality of first temperature distributions of the substrate; obtaining a second temperature distribution representing a sum of the plurality of first temperature distributions; obtaining one or more correction values for correcting an amount of light output from at least one or more light sources of the plurality of light sources based on the second temperature distribution; and correcting the amount of light output from each of the at least one or more light sources using the one or more correction values.

According to one aspect, it is possible to correct a control command so as to evenly heat an inspection object to be inspected.

DESCRIPTION OF THE EMBODIMENTS

Embodiment

Figure 1:
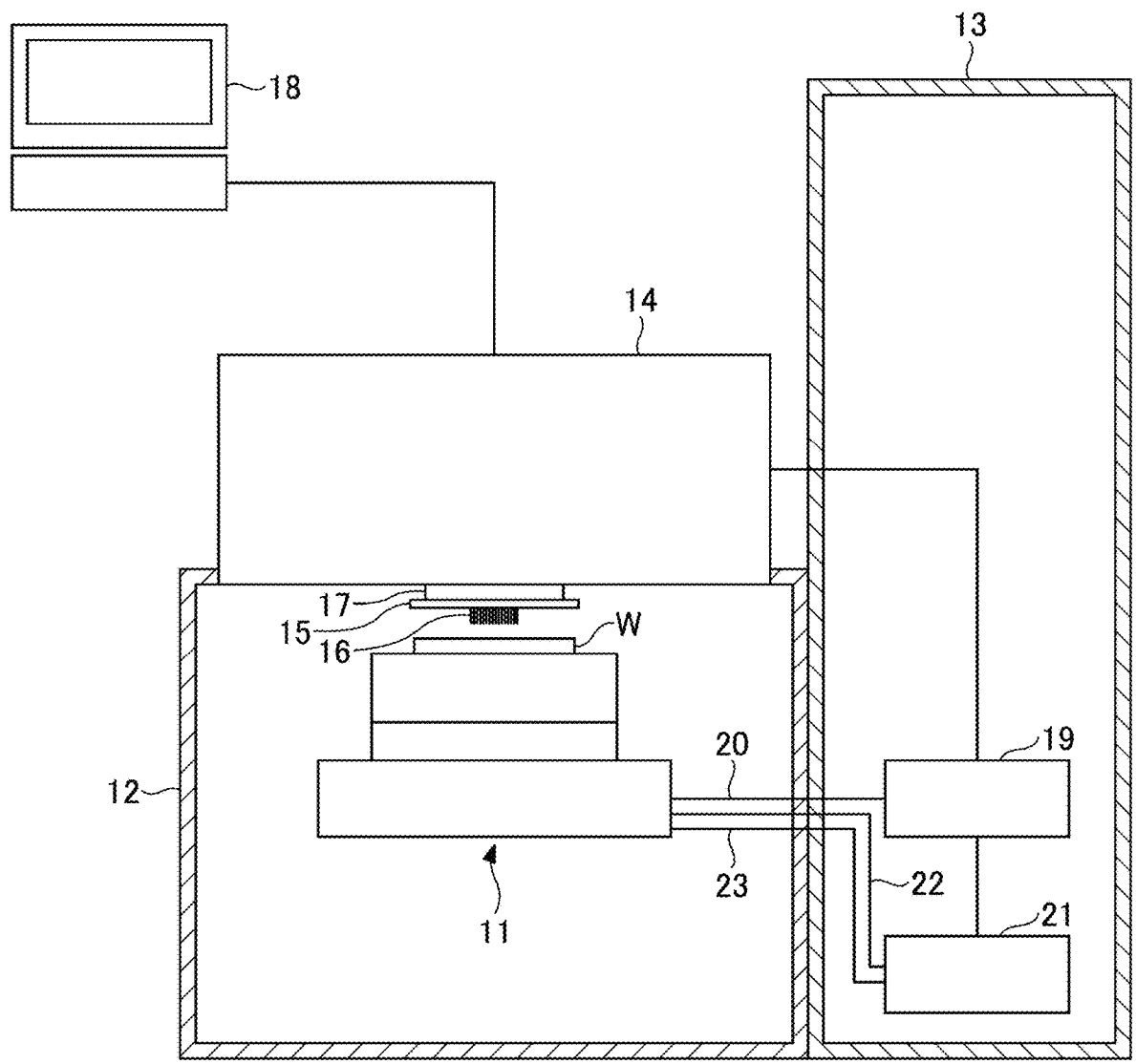
FIG. 1 is a cross-sectional view illustrating a configuration of an inspection apparatus according to the present embodiment.

In the following, an embodiment for carrying out the present disclosure will be described with reference to the drawings. In the specification and the drawings, the same components are indicated by the same reference numerals and overlapping descriptions may be omitted.

<Inspection Apparatus>

An inspection apparatus 10 including a stage (mounting stage) 11 according to the present embodiment will be described with reference to FIG. 1. FIG. 1 is an example of a cross-sectional view illustrating a configuration of the inspection apparatus 10 according to the present embodiment.

The inspection apparatus 10 is an apparatus that inspects electrical characteristics of each of a plurality of electronic devices (inspection objects) formed on a wafer (a substrate) W. It should be noted that the substrate having the inspections objects is not limited to the wafer W, but may be a carrier on which electronic devices are arranged, a glass substrate, a chip, or the like. The inspection apparatus 10 includes a chamber 12 that houses a stage 11 on which the wafer W is mounted, a loader 13 arranged adjacent to the chamber 12, and a tester 14 arranged over the chamber 12.

The chamber 12 has a housing shape with a hollow inside. Inside the chamber 12, the stage 11 for mounting the wafer W and a probe card 15 that is arranged to face the stage 11 are accommodated. The probe card 15 has a number of needle-shaped probes (contact terminals) 16 arranged corresponding to electrode pads or solder bumps provided corresponding to electrodes of the respective electronic devices of the wafer W.

The stage 11 includes a fixation mechanism (not illustrated) that fixes the wafer W to the stage 11. Thereby, a positional deviation of the wafer W relative to the stage 11 is prevented. The chamber 12 is also provided with a movement mechanism (not illustrated) that moves the stage 11 in the horizontal direction and in the vertical direction. Thereby, the relative position between the probe card 15 and the wafer W is adjusted so that electrode pads or solder bumps provided corresponding to the electrodes of the respective electronic devices contact the respective probes 16 of the probe card 15.

The loader 13 takes out the wafer W on which the electronic devices are arranged from a FOUP (not illustrated) that is a transportation container to mount the wafer W on the stage 11 inside the chamber 12, and removes the inspected wafer W from the stage 11 to house the wafer W in the FOUP.

The probe card 15 is connected to the tester 14 via an interface 17. Also, when the respective probes 16 contact the electrode pads or solder bumps provided corresponding to the electrodes of the respective electronic devices of the wafer W, the respective probes 16 supply electric power from the tester 14 to the electronic devices via the interface 17 or transmit signals from the electronic devices via the interface 17 to the tester 14.

The tester 14 includes a test board (not illustrated) that reproduces a part of a circuit configuration of a motherboard on which an electronic device is mounted, and the test board is connected to a tester computer 18 that determines whether the electronic device is good or bad based on signals from the electronic device. The tester 14 can reproduce the circuit configurations of a plurality of types motherboards by replacing the test board.

A control device 19 controls the operation of the stage 11. The control device 19 controls the movement mechanism (not illustrated) of the stage 11 to move the stage 11 in the horizontal direction and in the vertical direction. Also, the control device 19 is connected to the stage 11 by wiring 20. The control device 19 controls the operation of a light emission mechanism 40, which will be described later below, through the wiring 20. Further, the control device 19 is communicably connected to the tester 14, and information of the tester 14 is input to the control device 19.

A refrigerant supply device 21 is connected to a refrigerant flow path 31 of the stage 11 via a forward pipe 22 and a return pipe 23, and can circulate a refrigerant between the refrigerant supply device 21 and the refrigerant flow path 31 of the stage 11. The control device 19 controls the refrigerant supply device 21 to control the temperature, the flow rate, and the like of the refrigerant supplied from the refrigerant supply device 21 to the refrigerant flow path 31.

It should be noted that the control device 19 and the refrigerant supply device 21 are illustrated as being provided in the loader 13. However, the present disclosure is not limited thereto, and the control device 19 and the refrigerant supply device 21 may be provided at other positions.

According to the inspection apparatus 10, when inspecting the electrical characteristics of an electronic device, the tester computer 18 transmits data to the test board connected to the electronic device via each probe 16, and further determines whether the transmitted data has been processed correctly by the test board based on an electrical signal from the test board.

Figure 2:
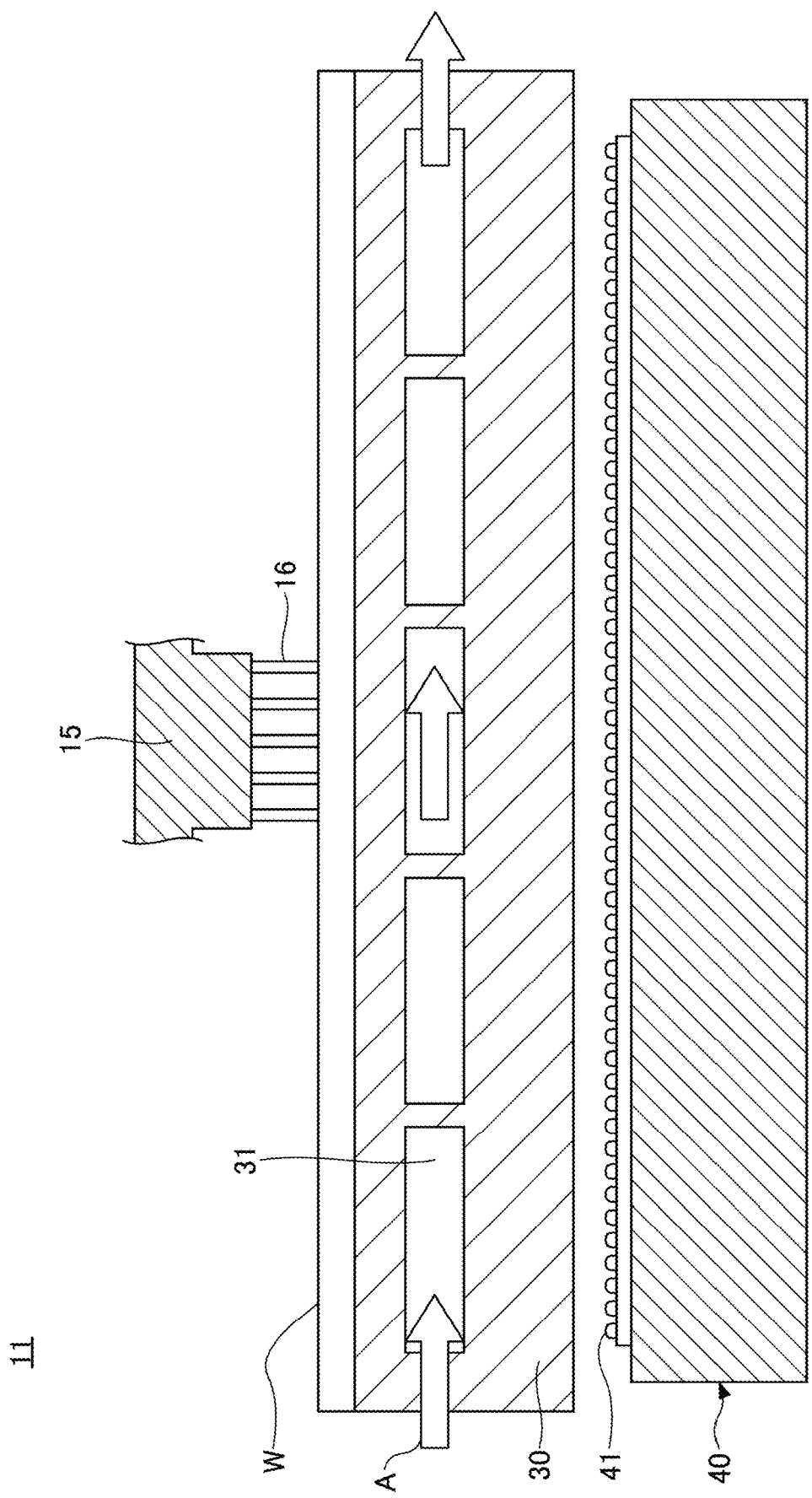
FIG. 2 is an example of a cross-sectional view illustrating a temperature adjustment mechanism of a wafer in the inspection apparatus according to the present embodiment.

Next, a temperature adjustment mechanism of the wafer W in the inspection apparatus 10 according to the present embodiment will be described with reference to FIG. 2. FIG. 2 is an example of a cross-sectional view illustrating a temperature adjustment mechanism of the wafer W in the inspection apparatus 10 according to the present embodiment. It should be noted that in FIG. 2, the flow of the refrigerant is indicated by the white arrows. Also, in FIG. 2, the light emission mechanism 40 emits light upward.

The stage 11 includes a mounting section 30 and the light emission mechanism 40.

On the mounting section 30, a wafer W where an electronic device is formed is mounted. The mounting section 30 is made of a translucent member that transmits light emitted from the light emission mechanism 40. Thereby, the light emitted from the light emission mechanism 40 passes through the mounting section 30 and is emitted to the back surface of the wafer W. Further, a refrigerant flow path (cooling section) 31 is formed in the stage 11. To the refrigerant flow path 31, the refrigerant is supplied from the refrigerant supply device 21 (see FIG. 1) via the forward pipe 22 (see FIG. 1). The refrigerant flowing through the refrigerant flow path 31 is returned to the refrigerant supply device 21 via the return pipe 23 (see FIG. 1). As the refrigerant, for example, water or Galden (registered trademark), which is a colorless and light transmissive liquid, may be used.

The light emission mechanism 40 includes a plurality of LEDs 41 that emit light. The LEDs 41 are sectioned for respective predetermined areas (see FIG. 4, which will be described below) in a plan view. The control device 19 can control the lighting and the amount of light for each of the sectioned LEDs 41. It should be noted that although the light emission mechanism 40 is described as using LEDs 41 as light sources, the type of light source is not limited thereto.

The light emitted from the light emission mechanism 40 passes through the mounting section 30 made of the translucent member and the refrigerant flowing through the refrigerant flow path 31 and is emitted to the back surface of wafer W. Then, by heating the wafer W to which the light is emitted, the electronic devices formed on the wafer W are heated. It should be noted that a light absorbing member may be included at the upper surface of the mounting section 30 (mounting surface of the wafer W). In the case of this configuration, the light emitted from the light emission mechanism 40 is emitted to the light absorbing member, and the light absorbing member is heated. Then, by the heat transferring from the light absorbing member to the wafer W, the electronic device formed on the wafer W is heated. Further, the light emission mechanism 40 can control the areas of the wafer W that are heated by the light emission mechanism 40 by controlling the sections for lighting the LEDs 41.

The probes 16 contact an electrode of an electronic device. The tester 14 (see FIG. 1) can cause current flow to the circuit within the electronic device by applying a voltage to the electrode of the electronic device through the probes 16.

Figure 3:
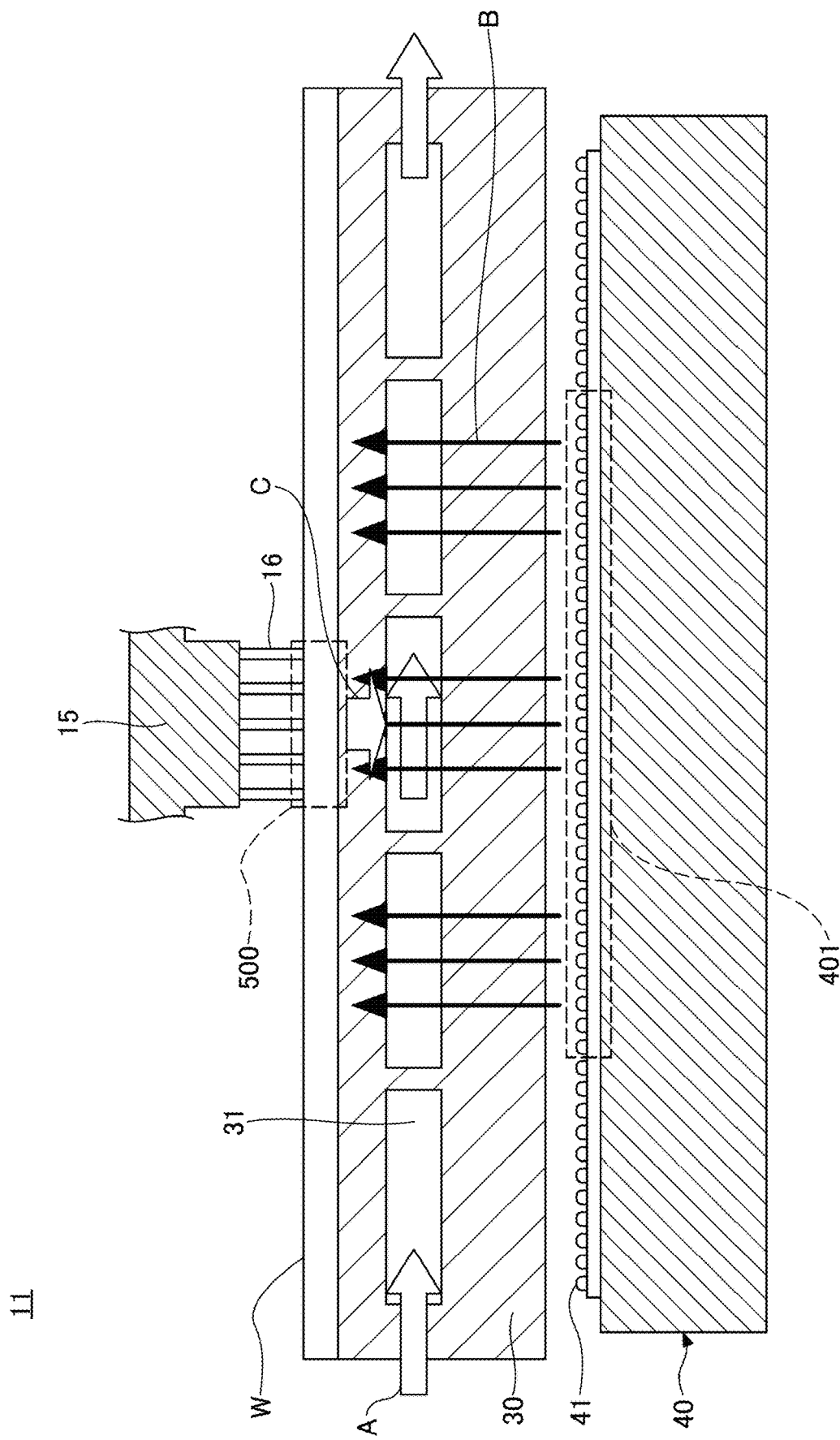
FIG. 3 is an example of a cross-sectional view illustrating an operation of a temperature adjustment mechanism at the time of inspection.
Figure 4:
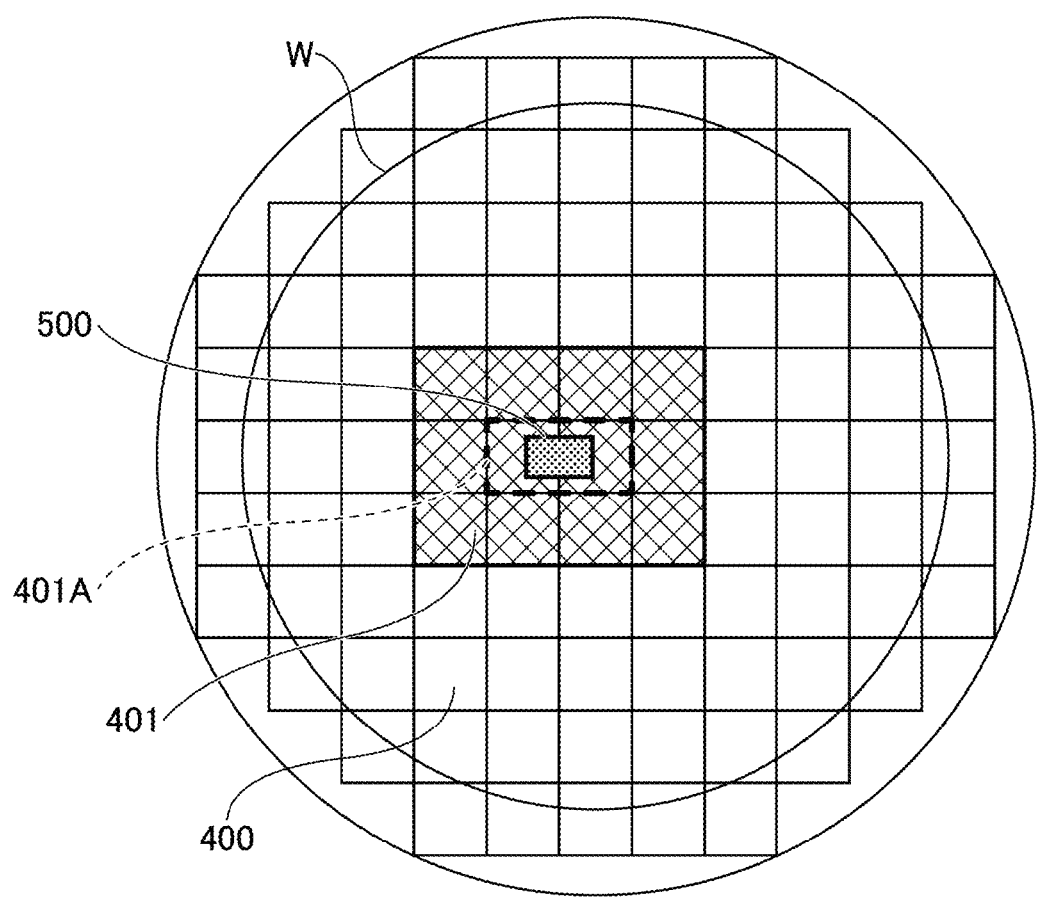
FIG. 4 is an example of a plan view illustrating an example of LED sections at the time of inspection.

FIG. 3 is an example of a cross-sectional view illustrating an operation of a temperature adjustment mechanism at the time of inspection. FIG. 4 is an example of a plan view illustrating an example of LED sections at the time of inspection. Also, in FIG. 3, the position of an electronic device 500 to be inspected is indicated by a broken line. Also, in FIG. 4, the position of the electronic device 500 to be inspected in plan view is shaded with dots. It should be noted that the electronic device 500 to be inspected may have a configuration for inspecting one chip or may have a configuration for inspecting a plurality of chips at the same time.

As illustrated in FIG. 4, the light emission mechanism 40 includes LED arrays 400 sectioned for respective predetermined areas. The LED arrays 400 are an example of light sources. FIG. 4 illustrates, as an example, 97 LED arrays 400. The LED array 400 for each section is represented by a square. Each LED array 400 is provided with a plurality of LEDs 41 (see FIG. 3). The control device 19 can control the lighting and the amount of light of the LEDs 41 for each of the LED arrays 400.

At the time of inspection, the control device lights one or more LED arrays 400 including the position of the electronic device 500 to be inspected and the LED arrays 400 surrounding the LED arrays 400 to emit light to the electronic device 500. Here, as an example, the electronic device 500 is present across the area of two LED arrays 400. Therefore, the LEDs 41 are lighted within an area 401 including a total of twelve LED arrays 400 of the two LED arrays 400 and ten LED arrays 400 surrounding the two LED arrays 400, and the light is emitted to the electronic device 500. It should be noted that, in the following, within the area 401, an area including the two LED arrays 400 where the electronic device 500 is present is referred to as a presence area 401A, which is indicated by a broken line in FIG. 4.

The tester 14 causes a current to pass through the electronic device 500 via the probe 16 to inspect the electronic device 500. It should be noted that, in FIG. 4, the area 401 of the LED arrays 400 that emit light is hatched. Also, in FIG. 3, the light emitted from the light emission mechanism 40 is illustrated by solid arrows B.

Also, the refrigerant is flowing in the refrigerant flow path 31 of the mounting section 30. The heat of the electronic device 500 is uniformly absorbed from the electronic device 500 to the mounting section 30, as illustrated by a white arrow C in FIG. 3. As a result, the temperature of the electronic device 500 to be inspected can be lowered. It should be noted that the control device 19 may feedback-control the light amounts of the respective LED arrays 400 based on detection values of a plurality of temperature sensors (not illustrated) provided on the stage 11. For example, the control device may feedback-control the light amounts of the respective LED arrays 400 based on detection values of a plurality of temperature sensors (not illustrated) provided on the stage 11.

Also, the control device 19 obtains, from the tester 14, information of power (power information) supplied from the tester 14 to the electronic device 500. The control device 19 may be configured to detect heat generation of the electronic device 500 based on the obtained information.

Since the inspection apparatus 10 can control the lighting and the light amounts of the LEDs 41 for the respective LED arrays 400, the heating zone can be limited, and the inspection apparatus 10 can cope with a sudden heat generation of the electronic device 500. On the other hand, since the uniformity in the temperature of the entire wafer W decreases, one or more correction values for correcting a control command are obtained in order to achieve uniformity in the temperature of the electronic device 500.

Figure 5A:
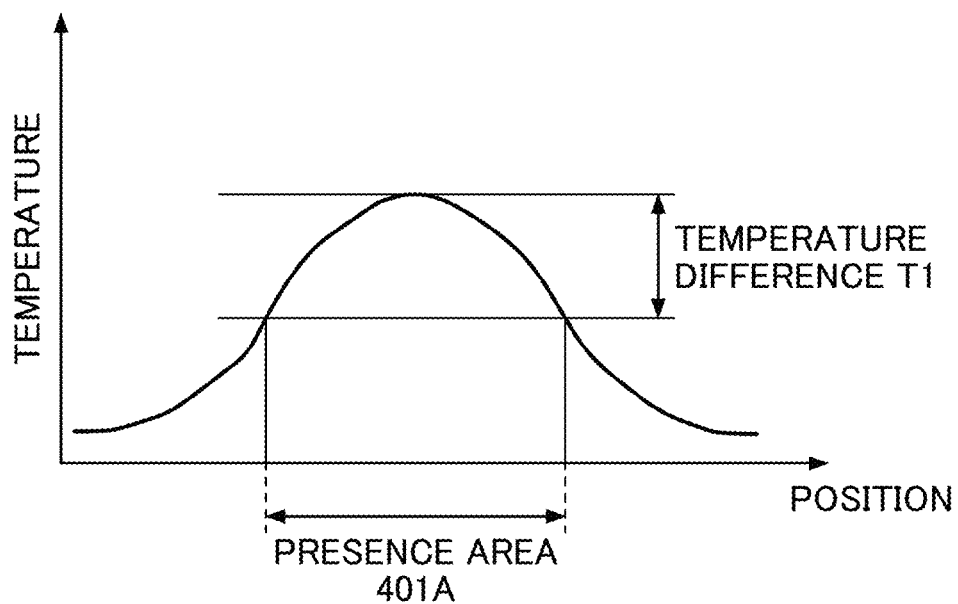
FIGS. 5A and 5B are each a diagram illustrating an example of a temperature distribution of the portion of a wafer W where an electronic device 500 to be inspected is located and its surroundings.
Figure 5B:
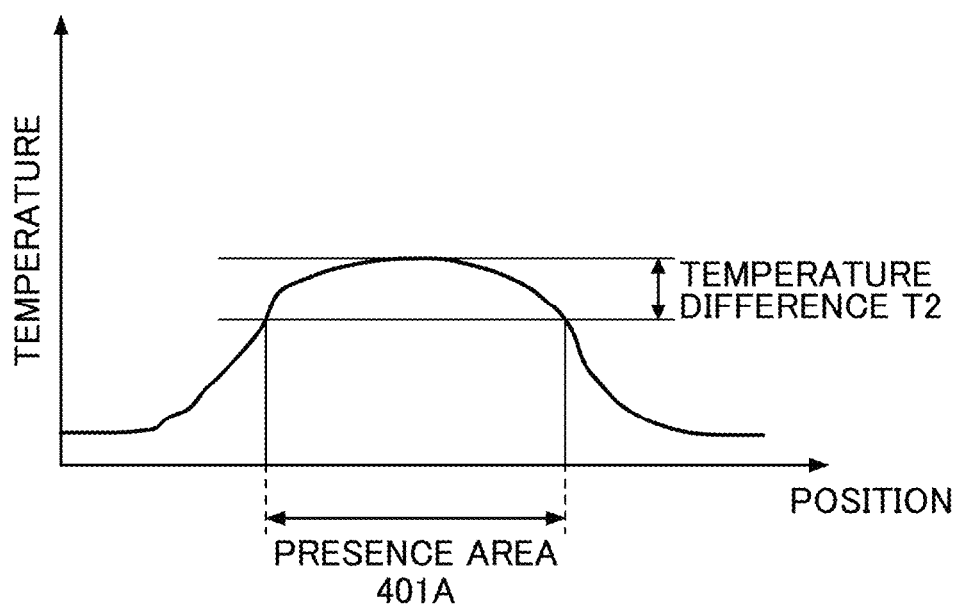

Each of FIGS. 5A and 5B is a diagram illustrating an example of a temperature distribution of the portion of the wafer W where the electronic device 500 to be inspected is located and its surroundings. FIG. 5A and FIG. 5B each illustrates the temperature distribution when the twelve LED arrays 400 in the area 401 illustrated in FIG. 4 are lighted. The two LED arrays 400 overlapping the electronic device 500 are surrounded by the peripheral LED arrays 400 that are lighted, and the peripheral ten LED arrays 400 are surrounded by peripheral LED arrays 400 that are not lighted.

The temperature distribution illustrated in FIG. 5A is the temperature distribution when the outputs of the twelve LED arrays 400 are equal. In this case, as illustrated in FIG. 5A, in the presence area 401A of the two LED arrays 400 overlapping the electronic device 500, the temperature of the wafer W is highest at the center, and a temperature difference T1 between the temperature at the center and the temperature at the boundary of the presence area 401A is relatively large.

On the other hand, the temperature distribution illustrated in FIG. 5B is a temperature distribution in a case in which the outputs of the surrounding ten LED arrays 400 are larger than the outputs of the two LED arrays 400 overlapping the electronic device 500. In this case, as illustrated in FIG. 5B, temperature within the presence area 401A of the two LED arrays 400 overlapping the electronic device 500 can be equalized, with a relatively small temperature difference T2 between the temperature at the center and the temperature at the boundary of the presence area 401A.

Figure 6:
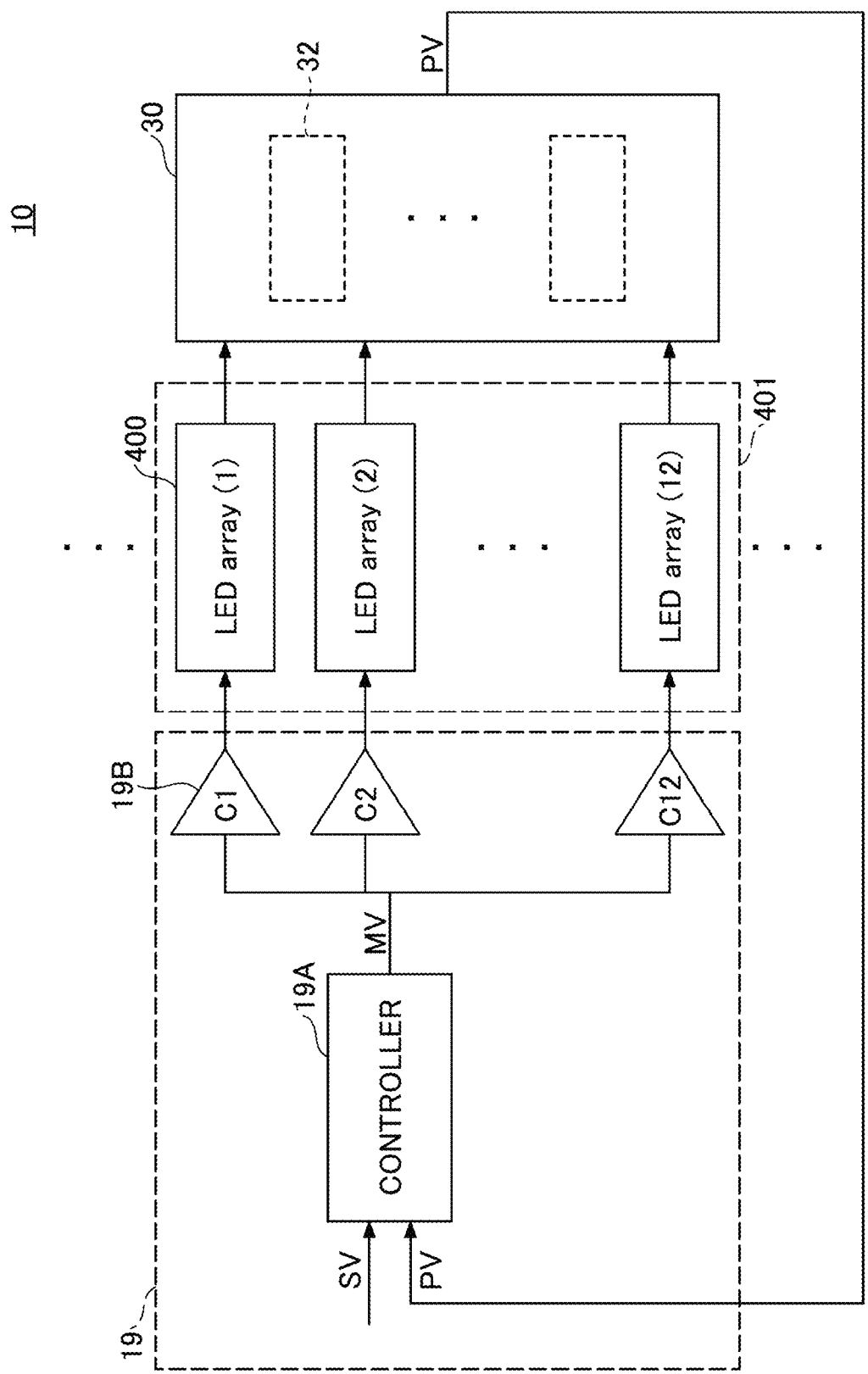
FIG. 6 is a diagram illustrating an example of a control system that feedback-controls the light amount of each LED array 400 of the inspection apparatus 10.

Since it takes a lot of time and effort to manually adjust the output of the LED arrays 400, the control device 19 of the inspection apparatus 10 includes one or more correctors capable of correcting the output of each LED array 400. FIG. 6 is a diagram illustrating an example of a control system that feedback-controls the light amount of each LED array 400 of the inspection apparatus 10. FIG. 6 illustrates the control device 19, the LED arrays 400, and the mounting section 30 of the inspection apparatus 10. The mounting section 30 is a chuck and includes a plurality of temperature sensors 32. The temperature sensors 32 may be of any configuration as it can detect the temperature of the wafer W mounted on the upper surface of the mounting section 30, and a thermoelectric pair or the like can be used as an example.

The control device 19 includes a controller 19A and a plurality of correctors 19B. Although the control device 19 also includes components other than the controller 19A and the plurality of correctors 19B, these components are omitted here. The control device 19 is implemented by a computer including a CPU (Central Processing Unit), a RAM (Random Access Memory), ROM (Read Only Memory), an internal bus, and the like. The controller 19A and the plurality of correctors 19B are indicated as functional blocks of functions of a program that is executed by the control device 19. It should be noted that although a configuration in which the correctors 19B are implemented by functional blocks of a computer is described here, the correctors 19B may be provided outside the control device 19 or may be implemented with hardware.

The controller 19A performs feedback control based on a temperature setting signal SV (Set Variable) read from an internal memory or the like of the control device 19 and current values PV (Process Variable) obtained from the temperature sensors 32, and outputs an operation command MV (Manipulative Variable). The temperature setting signal SV represents a target temperature that is set by a user of the inspection apparatus 10. The operation command MV is an example of a control command. At the time of inspection, the current value PV obtained from one temperature sensor 32 closest to the electronic device 500 is used. The current values PV represents the current temperatures detected by the temperature sensors 32. The controller 19A can individually light each LED array 400 by the operation command MV.

The respective correctors 19B are provided between the respective LED arrays 400 and the controller 19A. The corrector 19B is provided corresponding to each one of the LED arrays 400. As an example, when there are LED arrays 400, the control device 19 includes 97 correctors 19B. FIG. 6 illustrates twelve LED arrays 400 ((1) to (12)) included in the area 401 (see FIG. 4) and twelve correctors 19B. It should be noted that the twelve LED arrays 400 ((1) to (12)) are described as two LED arrays 400 (1) and (2) overlapping the electronic device 500 and ten surrounding LED arrays 400 (3) to (12) as an example. That is, the LED arrays 400 (1) and (2) are present in the presence area 401A of the two LED arrays 400 that overlap the electronic device 500 in plan view. The area including the LED arrays 400 (1) and (2)

in plan view are an example of a first area, which is equal to the presence area 401A. Also, the area including the LED arrays 400 (3) to (12) in plan view is an example of a second area.

As an example, the corrector 19B corrects the operation command MV (Manipulated Variable) output by the controller 19A, and outputs the corrected commands to the LED arrays 400. The twelve correctors 19B illustrated in FIG. 6 have respective correction values C1 to C12. The correctors 19B having the correction values C1 and C2 are connected to the respective LED arrays 400 (1) and (2), and the correctors 19B having the correction values C3 to C12 are connected to the respective LED arrays 400 (3) to (12).

The correction values C1 to C12 are set such that the correction values C3 to C12 are greater than the correction values C1 and C2 so that the electronic device 500 is evenly heated. This is for obtaining the temperature distribution as illustrated in FIG. 5. As an example, the respective correction values C1 to C12 have correction values for the plurality of respective LEDs 41 included in the corresponding respective LED arrays 400. Therefore, the light emission intensity of all LEDs 41 can be individually corrected. For the correction values C1 to C12, a value is set for each lighting pattern of the plurality of LEDs 41 in the light emission mechanism 40 as an example. It should be noted that the respective correction values C1 to C12 may be correction values for correcting the intensity of light emission for respective groups by dividing the plurality of LEDs 41 included in the corresponding respective LED arrays 400 into one or more groups.

Figure 7:
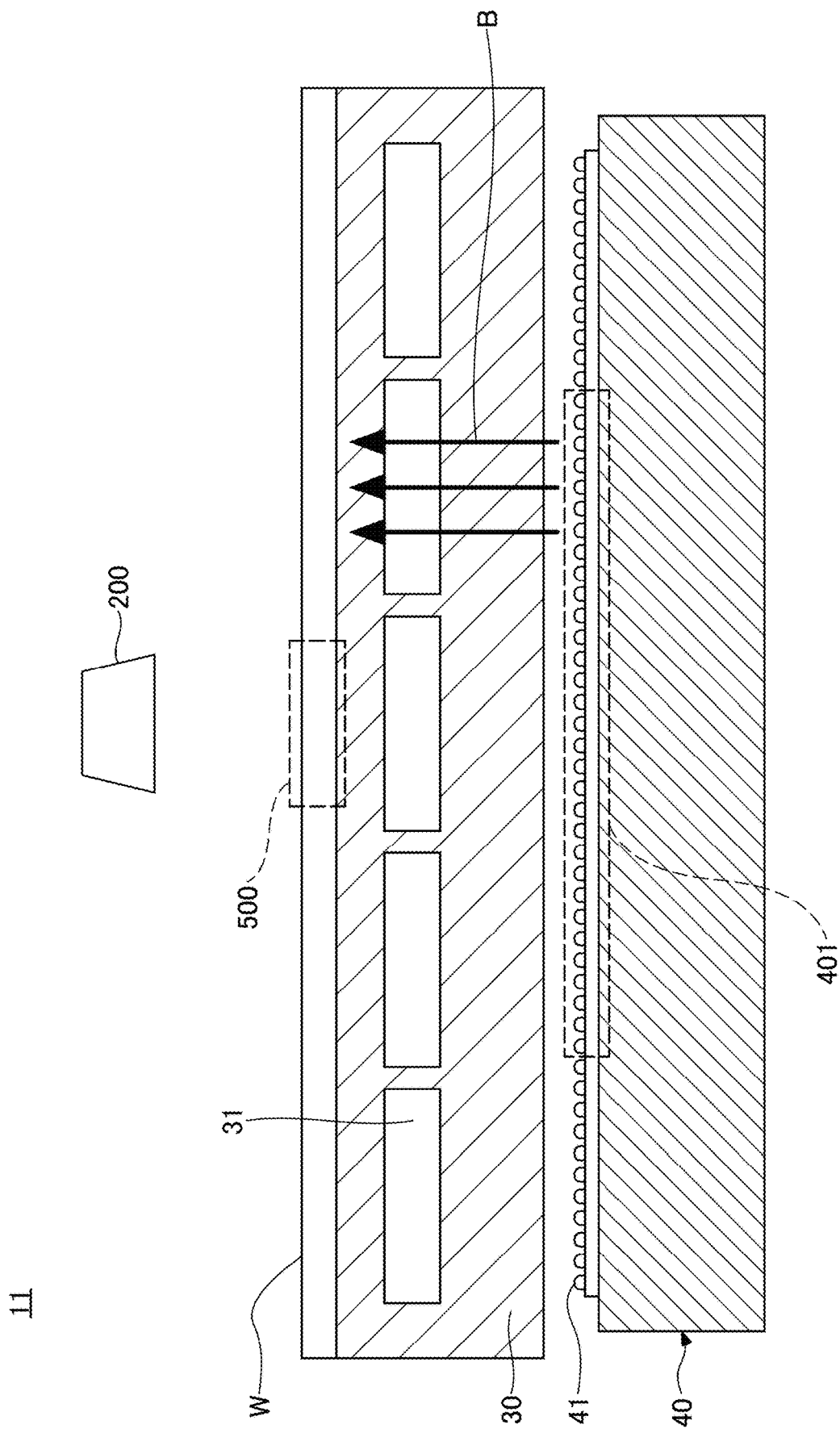
FIG. 7 is a diagram illustrating an example of a configuration for obtaining a thermal image.

Next, the method for obtaining the correction values C1 to C12 (the way of obtaining) will be described. When obtaining thermal images in order to obtain correction values C1 to C12, a wafer coated with a paint with high emissivity instead of an actual wafer W is used as a wafer for temperature measurement as an example. Here, the wafer coated with a high emissivity paint is referred to as a wafer Wa. FIG. 7 is a diagram illustrating an example of a configuration for obtaining a thermal image. As illustrated in FIG. 7, in a state in which the wafer Wa is mounted on the mounting section 30 and the electronic device 500 is not in contact with the probes 16 (see FIG. 3), the twelve LED arrays 400 in the area 401 may be lighted one by one, and the thermal image may be imaged by an IR (Infrared) camera 200 (which is an example of a thermal image obtaining section) from above the wafer Wa. The state in which the wafer Wa is mounted on the mounting section 30 and the electronic device 500 is not in contact with the probes 16 (see FIG. 3) can be realized by, for example, making a state in which the electronic device 500 is not in contact with the probes (see FIG. 3) while the tester 14 or the probe card 15 is removed. The IR camera 200 may be provided in the inspection apparatus 10 or may be provided in the inspection apparatus 10 only when a thermal image is obtained. Here, as an example, a configuration in which imaging control of the IR camera 200 is performed by the controller 19A will be described. Further, although the configuration described here obtains a thermal image using the IR camera 200, it is not limited to the IR camera 200 as long as it can obtain a thermal image.

Figure 8:
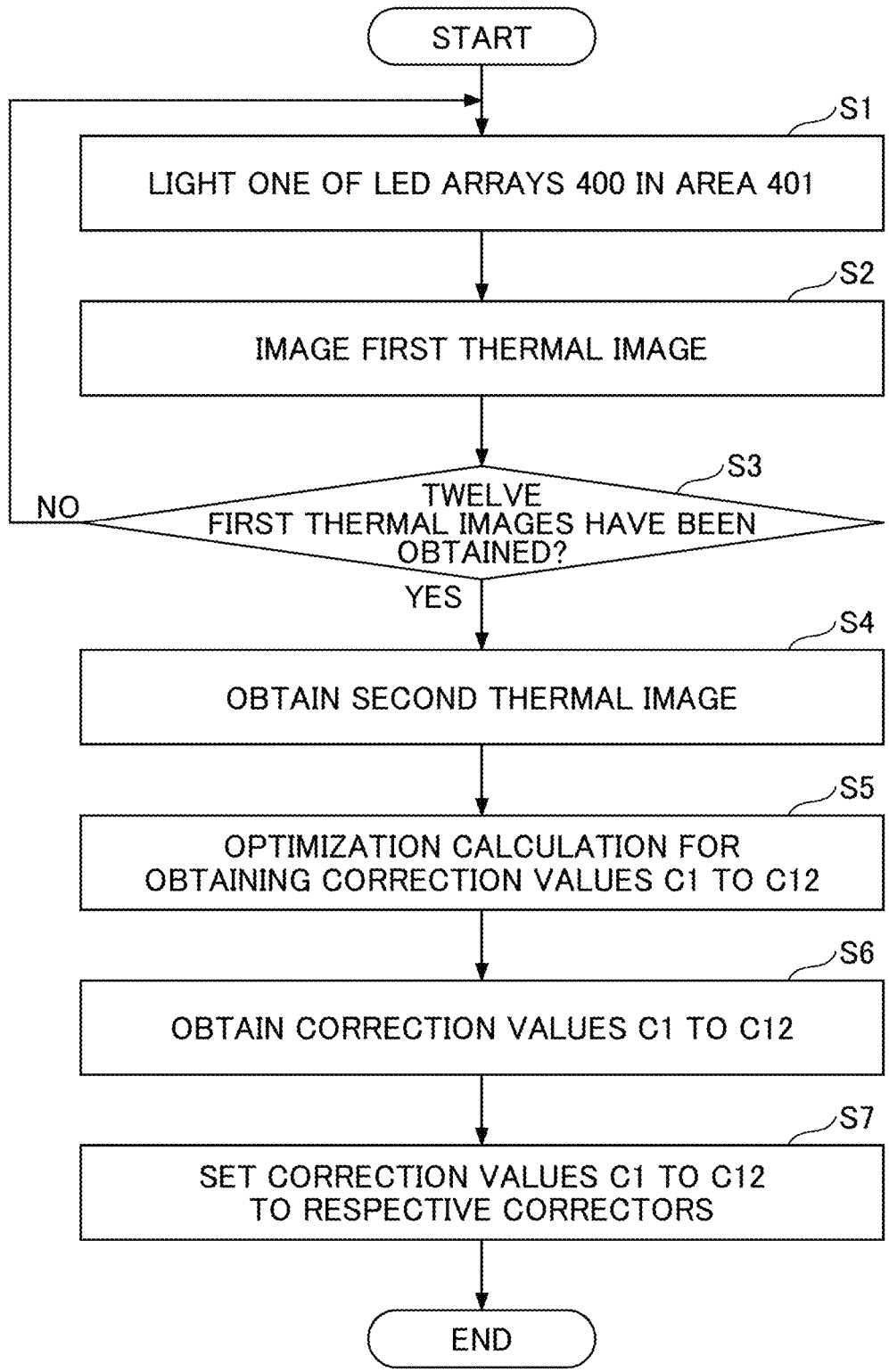
FIG. 8 is a flowchart illustrating an example of a process for obtaining correction values C1 to C12.
Figure 9:
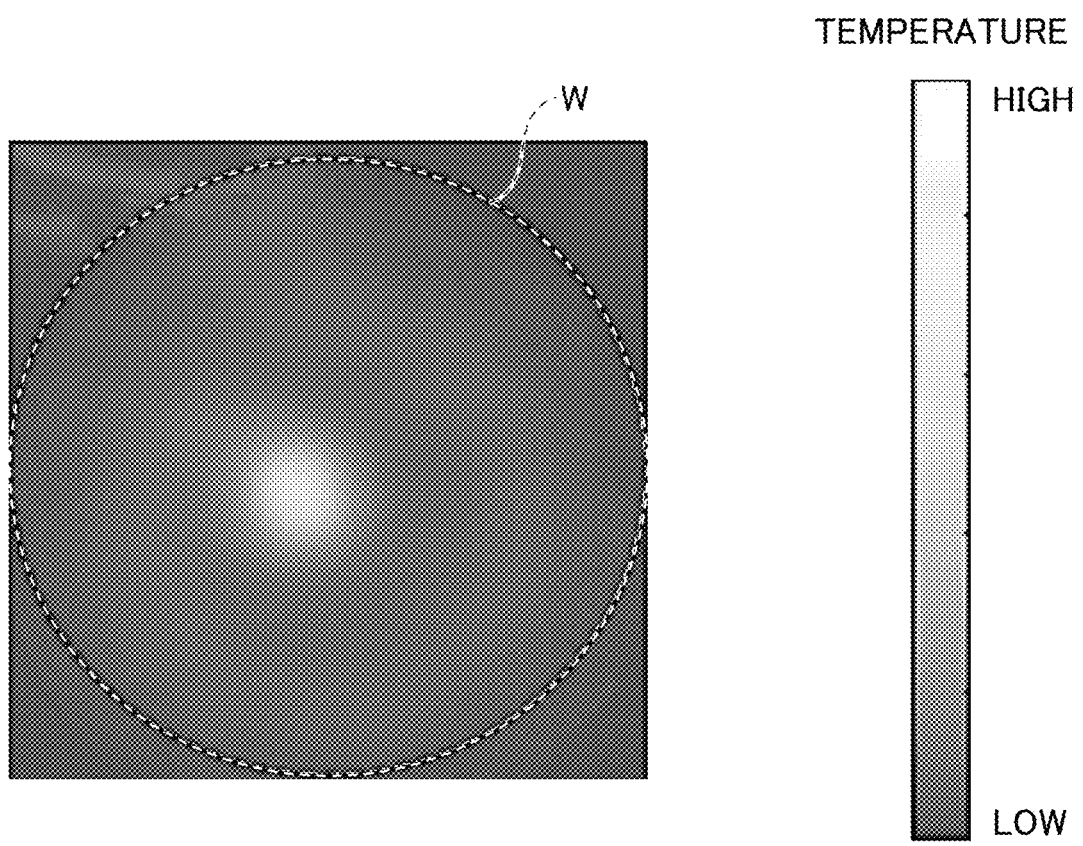
FIG. 9 is a diagram illustrating an example of a first thermal image.

Specifically, the correction values C1 to C12 may be obtained according to a flowchart illustrated in FIG. 8 as an example. FIG. 8 is a flowchart illustrating an example of a process for obtaining the correction values C1 to C12. The process illustrated in FIG. 8 is performed by the controller 19A. FIG. 9 is a diagram illustrating an example of a first thermal image.

In Step S1, upon starting a process, the controller 19A outputs an operation command MV under the condition in which a target temperature represented by a temperature setting signal SV is set, and lights one LED array 400 in the area 401. That is, the LED array 400 in the area 401 is individually lighted.

Next, in step S2, the controller 19A causes the IR camera 200 to image a first thermal image of the wafer Wa. The first thermal image obtained in step S2 represents the temperature distribution obtained in a state in which any one of the twelve LED arrays 400 in the area 401 is lighted. The temperature distribution obtained from the first thermal image obtained in step S2 is an example of a first temperature distribution.

In step S3, the controller 19A determines whether or not twelve first thermal images have been obtained.

Upon determining that twelve first thermal images have not been obtained (S3: NO), the controller 19A returns the flow to step S1. Thus, the process of step S1 and step S2 is repeated twelve times, and the twelve first thermal images as illustrated in FIG. 9 are obtained.

Upon determining that the twelve first thermal images have been obtained (S3: YES), the controller 19A obtains a second thermal image obtained by taking, for each of all pixels in the presence area 401A, the sum of the temperatures for each pixel of the twelve first thermal images (step S4). In step S4, with respect to all pixels in the presence area 401A of the twelve first thermal images obtained by repeating step S2 twelve times, the second thermal image is generated by taking the sum of the temperatures for each pixel. The temperature distribution represented by the second thermal image obtained in step S4 is a temperature distribution obtained by taking the sum of the temperatures for each pixel of the twelve first temperature distributions for all pixels in the presence area 401A, and is an example of a second temperature distribution. The first thermal image has values of temperature for all pixels included in the entire area of the wafer Wa, whereas the second thermal image has values of temperature for only pixels in the presence area 401A.

Using the second thermal image obtained in Step S4, the controller 19A performs optimization calculation for obtaining the correction values C1 to C12 to minimize the temperature difference T2 (see FIG. 5B) under the condition in which the target temperature represented by the temperature setting signal SV is set (Step S5). The optimization calculation is calculation for solving the optimization problem for obtaining the combination of the correction values C1 to C12 that minimizes the temperature difference T2 under the condition in which the target temperature represented by the temperature setting signal SV is set.

For example, the temperature of one pixel of the second thermal image obtained in step S4 is the sum of the temperatures of the corresponding one pixel in the presence area 401A of the twelve first thermal images obtained by repeating step S1 and step S2 twelve times, and therefore it can be expressed by the following equation (1).

Equation 1

$$T_{total} = T0 + \sum_{i=1}^{12} Ci(Ti - T0) \tag{1}$$

In the equation (1), $T_{total}$ represents the temperature of one pixel of the second thermal image (the sum of the temperatures of the corresponding pixel in the twelve first thermal images) and Ci represents the correction values C1 to C12. Ti represents the temperature of the corresponding pixel in the first thermal image, T0 represents the temperature when the LEDs 41 are not lighted, and T1 to T12 are obtained for the twelve thermal images. The equation (1) indicates that the second thermal image is a function of Ci and second thermal image varies depending on the correction value Ci. Therefore, the temperature distribution when the correction values Ci are changed can be obtained by simulation without actually lighting the LEDs 41.

The controller 19A solves the optimization problem for obtaining the correction values C1 to C12 that minimize an evaluation function V represented by the following equation (2). In the equation (2), $T_{SV}$ is the target temperature represented by the temperature setting signal SV.

Equation 2

$$V = \Sigma(T_{total} - T_{SV}) \quad (2)$$

The equation (2) is an equation for calculating the sum of squares of the difference between the temperature $T_{total}$ obtained by the equation (1) and the target temperature $T_{SV}$ for all pixels of the second thermal image. In other words, the equation (2) is an equation for calculating the sum for every pixel of the squared value of the difference between the temperature $T_{total}$ obtained by the equation (1) and the target temperature $T_{SV}$. When the evaluation function V of the equation (2) is minimized, the combination of the correction values C1 to C12 at which the temperature difference T2 is minimized can be obtained under the condition in which the target temperature represented by the temperature setting signal SV is set. In other words, in the optimization calculation, the correction values Ci are obtained by performing an inverse calculation so that the temperature distribution is close to the target temperature $T_{SV}$. It should be noted that the evaluation function of the equation (2) is an example, and if the combination of the correction values C1 to C12 that minimizes the temperature difference T2 can be obtained, an evaluation function other than the equation (2) may be used.

The controller 19A obtains the correction values C1 to C12 obtained by the optimization calculation (step S6). As described above, under the condition in which the target temperature represented by the temperature setting signal SV is set, the combination of the correction values C1 to C12 at which the temperature difference T2 is minimized is obtained.

The controller 19A sets the correction values C1 to C12 to the respective twelve correctors 19B (step S7). Accordingly, the twelve correctors 19B output operation commands CiMV (i is 1 to 12) multiplied by the correction values C1 to C12. As a result, the light amounts of the LED arrays 400 (1) to (12) are corrected, and the amounts of heat by which the electronic device 500 is heated by the respective LED arrays 400 are corrected. Such correction values may be calculated and set, for example, when the inspection apparatus 10 is shipped from a factory or when maintenance of the inspection apparatus 10 is performed.

As described above, under the condition in which the target temperature represented by the temperature setting signal SV is set, the first thermal images are obtained while the electronic device 500 is heated by lighting (individually) the twelve LED arrays 400 one by one in the area 401. Then, the second thermal image representing the sum of the temperatures for each pixel in the area 401A of the twelve first thermal images is obtained. The second thermal image represents the temperature distribution in a state in which the twelve LED arrays 400 are lighted to heat the electronic device 500. Then, by performing the optimization calculation according to the equation (2) using the temperature $T_{Total}$ obtained for each pixel in the area 401A in the second thermal image, under the condition in which the target temperature represented by the temperature setting signal SV is set, the combination of the correction values C1 to C12 at which the temperature difference T2 is minimized is obtained and set to the twelve correctors 19B.

Accordingly, it is possible to provide the inspection apparatus 10 and the control method of the inspection apparatus 10 that enable to correct a control command so as to evenly heat the electronic device 500 that is an inspection object to be inspected.

In addition, since the first thermal images are obtained by the IR camera 200, the first temperature distributions can be easily obtained and the step of obtaining the correction values C1 to C12 can be simplified.

In addition, since the second thermal image is generated by taking the sum of the temperatures of each pixel of the twelve first thermal images obtained for the area 401, and the second temperature distribution represented by the second thermal image is obtained, the second temperature distribution can be accurately and efficiently obtained even when the number of LED arrays 400 is large.

Also, when obtaining the second temperature distribution, the second thermal image is generated by taking the sum of the temperatures of each pixel in the presence area 401A out of the pixels of the twelve first thermal images obtained for the area 401, and the second temperature distribution represented by the second thermal image is obtained. Therefore, the second temperature distribution can be more efficiently obtained.

Also, since the correction values C1 to C12 of the twelve correctors 19B are obtained by solving the optimization problem that minimizes the sum of squares of the difference between the sum of the temperatures in each pixel of the second thermal image and the predetermined temperature, the optimum correction values C1 to C12 can be obtained by calculation without actually trying various combinations of correction values C1 to C12. In other words, the correction values C1 to C12 that minimize the evaluation function V represented by the equation (2) can be easily and efficiently obtained.

Further, when the first temperature distributions are obtained, the twelve LED arrays 400 in the area 401 are lighted one by one (individually), and therefore the correction values at the time of lighting in response to a sudden heat generation of the electronic device 500 in a limited heating zone can be obtained.

Also, the correction values C1 to C12 are set such that the correction values C3 to C12 for the ten correctors 19B corresponding to the ten LED arrays 400 around the presence area 401A within the area 401 are greater than the correction values Cl and C2 for the two correctors 19B corresponding to the LED arrays 400 within the presence area 401A. Therefore, adjustment can be performed to decrease the temperature of the portion where the temperature tends to be high, such as the central portion of the area 401, and to increase the temperature of the portion where the temperature tends to be low, such as the surroundings, thereby achieving uniformity of the temperature distribution within the area 401.

In the configuration described above, the correction values C1 to C12 are obtained by performing the optimization calculation. However, the correction values C1 to C12 may be calculated by a calculation method other than the optimization calculation.

Further, although the embodiment has been described in which the twelve correction values are obtained for the respective twelve correctors 19B connected to the twelve LED arrays 400 ((1) to (12)), for example, the correction value need not be obtained for the corrector 19B connected to any one of the LED arrays 400. More specifically, for example, without obtaining the correction value for the corrector 19B connected to the LED array 400 (1) or (2), the LED array 400 may be lighted by the operation command MV. In this case, the corrector 19B connected to the LED array 400 (1) or (2) may output the operation command MV without correction. Also, the correction values for a plurality of correctors 19B may not be obtained.

Further, the light emission mechanism 40 has been described above as emitting light from the back surface side of the wafer W (or the wafer Wa), but the light emission mechanism 40 is not limited thereto. The light emission mechanism 40 may be configured to emit light from the front surface side of the wafer W.

Although an embodiment of the control method of the inspection apparatus and the inspection apparatus according to the present disclosure have been described above, the present disclosure is not limited to the embodiment or the like described above. Various modifications, modifications, substitutions, additions, deletions, and combinations are possible within the scope of claims. They are of course within the technical scope of the present disclosure.

What is claimed is:

1. A control method of an inspection apparatus including
a stage on which a substrate having an inspection object to be inspected is mounted and
a plurality of light sources configured to emit light to heat the substrate,
wherein the control method comprises:
individually lighting the plurality of light sources and obtaining a plurality of first temperature distributions of the substrate;
obtaining a second temperature distribution representing a sum of the plurality of first temperature distributions;
obtaining one or more correction values for correcting an amount of light output from at least one or more light sources of the plurality of light sources based on the second temperature distribution; and
correcting the amount of light output from each of the at least one or more light sources using the one or more correction values,
wherein the obtaining of the plurality of first temperature distributions includes obtaining first thermal images by imaging the substrate with a thermal image obtaining section, and
wherein the sum of the plurality of first temperature distributions is calculated based on the first thermal images.

2. The control method of the inspection apparatus according to claim 1,
wherein the plurality of light sources are arranged at a plurality of respective areas that are sectioned in plan view,
wherein the plurality of areas include one or more first areas where the inspection object to be inspected is located, a plurality of second areas surrounding the one or more first areas, and an area other than the one or more first areas and the second areas, and
wherein, when obtaining the first temperature distributions, only a plurality of light sources, corresponding to the one or more first areas and the plurality of second areas, of the plurality of light sources are individually lighted.

3. The control method of the inspection apparatus according to claim 2, wherein a correction value for a plurality of light sources corresponding to the plurality of second areas of the plurality of light sources is greater than a correction value for one or more light sources corresponding to the one or more first areas of the plurality of light sources.

4. The control method of the inspection apparatus according to claim 1,
wherein the obtaining of the one or more correction values includes obtaining a plurality of correction values for correcting the amount of light output from the plurality of light sources based on the second temperature distribution, and
wherein the correcting of the amount of light using the one or more correction values includes correcting the amount of light output from each of the plurality of respective light sources using the plurality of respective correction values.

5. The control method of the inspection apparatus according to claim 1, wherein the obtaining of the second temperature distribution includes obtaining, as the second temperature distribution, a temperature distribution represented by a second thermal image having a sum of temperatures for each pixel of the plurality of first thermal images.

6. The control method of the inspection apparatus according to claim 5,
wherein the second thermal image is a thermal image having, for pixels in a presence area of the first thermal images, a sum of temperatures for each pixel of the first thermal images, and
wherein the presence area is an area where one or more light sources of the plurality of light sources are located where the inspection object to be inspected is present in plan view.

7. The control method of the inspection apparatus according to claim 5, wherein the obtaining of the one or more correction values includes obtaining, by optimization calculation, a combination of the one or more correction values that minimize a sum of squares of a difference between the sum of the temperatures in each pixel of the second thermal image and a predetermined temperature.

8. The control method of the inspection apparatus according to claim 7, wherein the predetermined temperature is a setting temperature used when inspecting the inspection object to be inspected.

9. An inspection apparatus comprising:
a stage on which a substrate having an inspection object to be inspected is mounted;
a plurality of light sources configured to emit light to heat the substrate;
a controller configured to control the plurality of light sources; and
one or more correctors configured to correct one or more respective control commands output from the controller to at least one or more respective light sources of the plurality of light sources,
wherein the controller performs
individually lighting the plurality of light sources and obtaining a plurality of first temperature distributions of the substrate;
obtaining a second temperature distribution representing a sum of the plurality of first temperature distributions;
obtaining one or more correction values for correcting, by the one or more correctors, an amount of light output from the at least one or more light sources based on the second temperature distribution; and correcting the amount of light output from each of the at least one or more respective light sources by the one or more respective correctors using the one or more correction values,
wherein the obtaining of the plurality of first temperature distributions includes obtaining first thermal images by imaging the substrate with a thermal image obtaining section, and
wherein the sum of the plurality of first temperature distributions is calculated based on the first thermal images.

* * * * *